United States Patent
Long

(10) Patent No.: US 10,681,817 B2
(45) Date of Patent: Jun. 9, 2020

(54) FRAME EMBEDDED COMPONENTS

(71) Applicant: Intel Corporation, Santa Clara, CA (US)

(72) Inventor: Brian J. Long, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/327,435

(22) PCT Filed: Sep. 27, 2016

(86) PCT No.: PCT/US2016/053902
§ 371 (c)(1),
(2) Date: Feb. 22, 2019

(87) PCT Pub. No.: WO2018/063150
PCT Pub. Date: Apr. 5, 2018

(65) Prior Publication Data
US 2019/0215964 A1    Jul. 11, 2019

(51) Int. Cl.
*H05K 1/11* (2006.01)
*H05K 1/18* (2006.01)
(Continued)

(52) U.S. Cl.
CPC ............ *H05K 1/186* (2013.01); *H05K 1/111* (2013.01); *H05K 1/117* (2013.01); *H05K 1/141* (2013.01);
(Continued)

(58) Field of Classification Search
CPC ............ H05K 1/111; H05K 1/117; H05K 1/141–145; H05K 1/181–183;
(Continued)

(56) References Cited

U.S. PATENT DOCUMENTS

2004/0183186 A1    9/2004  Hirose
2007/0081314 A1    4/2007  Nakatani
(Continued)

FOREIGN PATENT DOCUMENTS

JP    2005166892 A    6/2005
WO    2018063150 A1    4/2018

OTHER PUBLICATIONS

PCT International Search Report and Written Opinion issued in PCT Application No. PCT/US2016/053902 dated Jun. 19, 2017.

*Primary Examiner* — Hoa C Nguyen
(74) *Attorney, Agent, or Firm* — Patent Capital Group

(57) ABSTRACT

Aspects of the disclosure are directed to an edge card that includes a printed circuit board having a top side and a bottom side. The top side of the printed circuit board can include one or more top-side circuit components, and a plurality of top-side metal contact fingers, at least some of the top-side metal contact fingers electrically connected to at least one of the one or more circuit components. The bottom side of the printed circuit board can include one or more bottom-side circuit components. The bottom side of the printed circuit board can also include a substrate interposer having a top side and a bottom side. The top side of the substrate interposer can include one or more passive circuit components at least partially embedded in the substrate interposer, and one or more solder balls arranged around the one or more passive circuit components.

20 Claims, 19 Drawing Sheets

(51) Int. Cl.
*H05K 1/14* (2006.01)
*H05K 3/40* (2006.01)
*H05K 3/28* (2006.01)
*H05K 3/34* (2006.01)
*H05K 3/36* (2006.01)
*H01R 12/72* (2011.01)

(52) U.S. Cl.
CPC ............. *H05K 1/181* (2013.01); *H05K 3/284* (2013.01); *H05K 3/34* (2013.01); *H05K 3/368* (2013.01); *H05K 3/4015* (2013.01); *H01R 12/721* (2013.01); *H05K 1/185* (2013.01); *H05K 2201/042* (2013.01); *H05K 2201/1003* (2013.01); *H05K 2201/10015* (2013.01); *H05K 2201/10022* (2013.01); *H05K 2201/10159* (2013.01); *H05K 2201/10378* (2013.01); *H05K 2201/10545* (2013.01); *H05K 2201/10734* (2013.01); *H05K 2203/0228* (2013.01); *H05K 2203/107* (2013.01); *H05K 2203/1316* (2013.01); *H05K 2203/1327* (2013.01)

(58) Field of Classification Search
CPC ..... H05K 1/186–188; H05K 2201/042; H01R 12/721–727
See application file for complete search history.

(56) References Cited

U.S. PATENT DOCUMENTS

| | | | |
|---|---|---|---|
| 2007/0285907 A1* | 12/2007 | Nishikawa | H01L 23/50 361/763 |
| 2009/0279243 A1* | 11/2009 | Amidi | G11C 5/04 361/679.31 |
| 2011/0089553 A1 | 4/2011 | Kim et al. | |
| 2012/0162928 A1* | 6/2012 | Das | H05K 7/00 361/728 |
| 2013/0127025 A1 | 5/2013 | Cho | |
| 2013/0271907 A1* | 10/2013 | Mortensen | H01L 21/4846 361/679.02 |
| 2016/0005714 A1* | 1/2016 | Lee | H01L 25/0652 257/777 |
| 2016/0276307 A1* | 9/2016 | Lin | H01L 21/561 |
| 2018/0240757 A1* | 8/2018 | Wong | H01L 23/552 |

* cited by examiner

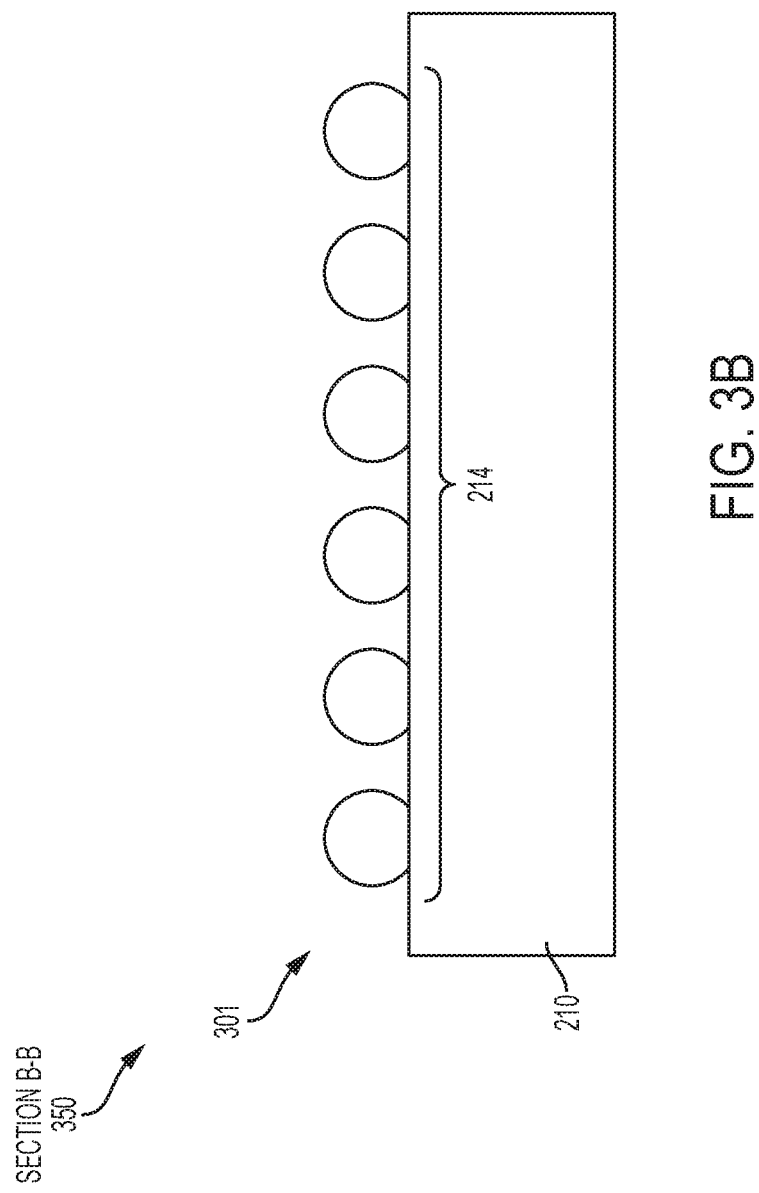

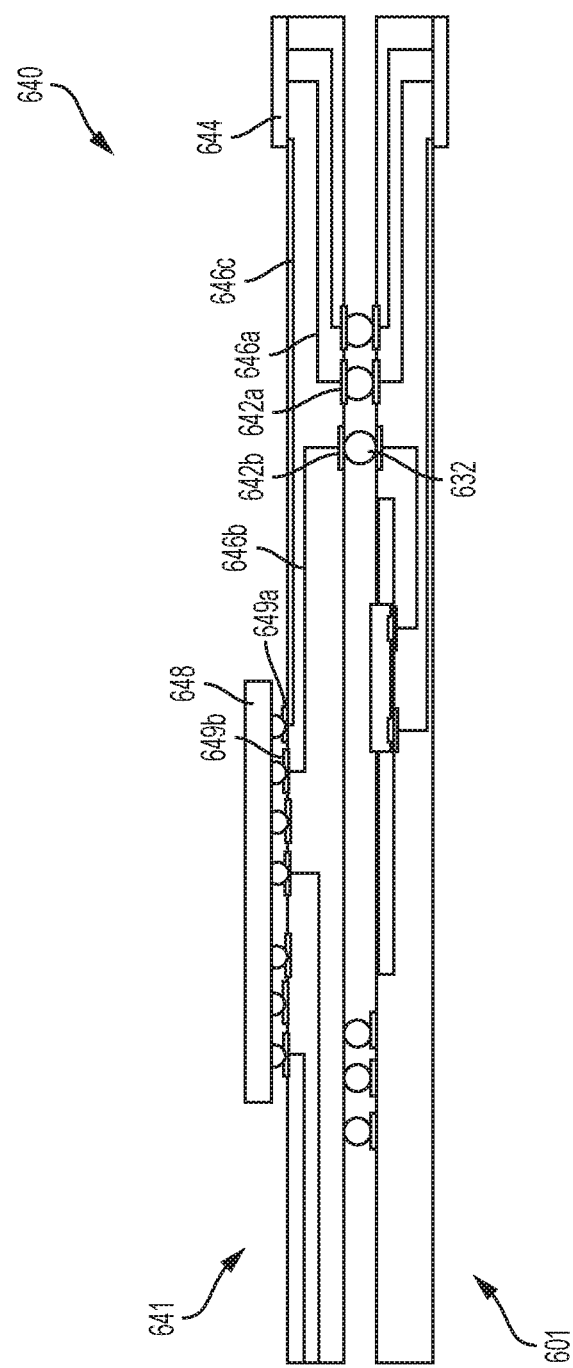

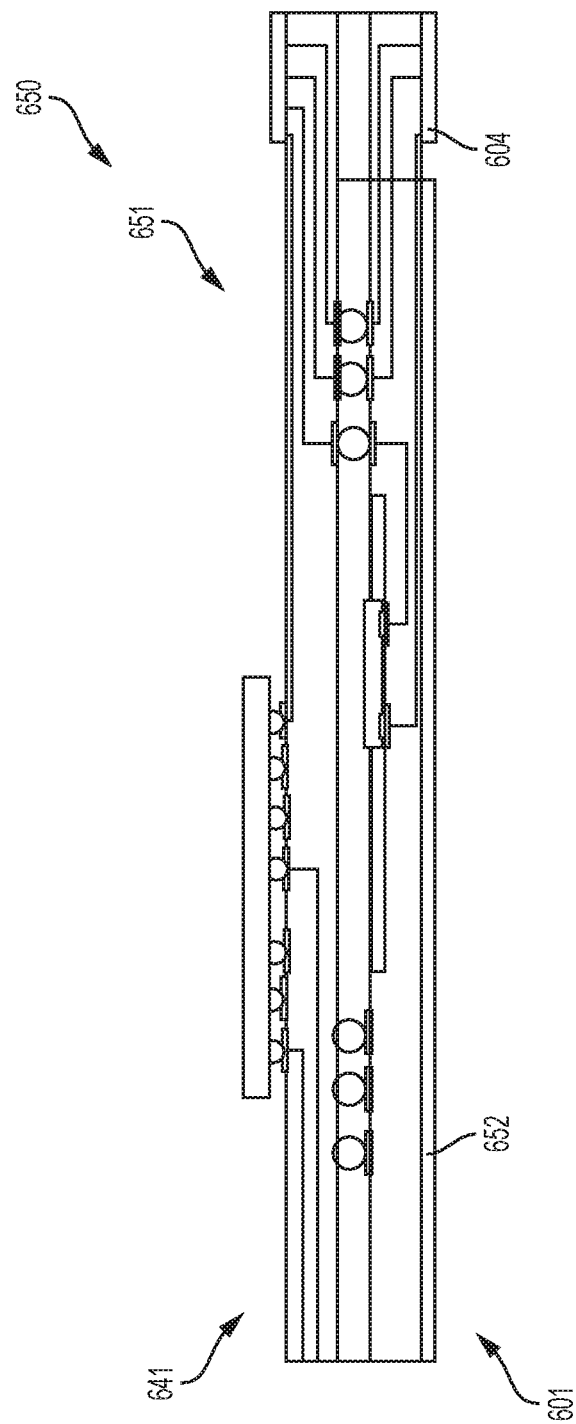

US 10,681,817 B2

FRAME EMBEDDED COMPONENTS

CROSS REFERENCE TO RELATED APPLICATION

This Application is a 371 of PCT International Application No. PCT/US2016/053902, filed Sep. 27, 2016, entitled "FRAME EMBEDDED COMPONENTS." The disclosure of this prior application is considered part of (and is incorporated by reference in) the disclosure of this application.

TECHNICAL FIELD

This disclosure pertains to frame embedded components, and more particularly, to increasing printed circuit board area utilization by embedding passive circuit components.

BACKGROUND

Electronic devices need to provide more functionality at an ever shrinking form factor. Tablet and ultra-small (or ultra-thin) PCs require devices such as storage (SSD/HDD) and wireless modems (WiFi adaptor).

FIG. 1 is a schematic diagram of an example edge-card 100. The edge card has a "gum-stick" form factor. The "gum-stick" form factor edge-card connection allows for hardware swapping and upgrades, and has a thickness and X-Y footprint that takes up valuable real estate in the device. The example in FIG. 1 shows a basic "gum-stick" SSD card design 100 with components on one side. Components include an ASIC 102a, flash memory 102b-c, and passive components 104. Each of the three types of components (and the edge card connector itself) contribute to the X dimension of the card, and the total thickness (Z dimension) is defined by the thickest component plus the thickness of the card. Typically, the total Z dimension of the card (~1 mm) with the flash packaging and other components (~1 mm) is on the order of 2 mm.

BRIEF DESCRIPTION OF THE DRAWINGS

FIGS. 3A-B is a schematic diagram of an example ball grid array substrate interposer.

FIGS. 6A-F are schematic diagrams of a process for forming an edge card with a substrate interposer in accordance with embodiments of the present disclosure.

Features shown in the figures are for illustrative purposes and are not drawn to scale.

DETAILED DESCRIPTION

This disclosure pertains to embedding passive electrical components (e.g., passive circuit components, such as resistors, capacitors, etc.) within a ball grid array (BGA) substrate interposer. Embedding passive components into the BGA substrate interposer facilitates the movement of passive electrical components away from Printed Circuit Board Assembly (PCBA) real estate so that PCBA area can be used for placing additional memory components, DRAM, or ASIC packages (or other e.g., components, including non-passive and passive components not embedded). This disclosure describes embedding passive components in a BGA substrate interposer used for any PCBA, such as those in which a high density of GBytes/mm^2 is required, whether to meet product requirements or for a competitive advantage. The passive electrical components can be moved within a volumetric region that is currently utilized for gold finger connections.

Figure 1:
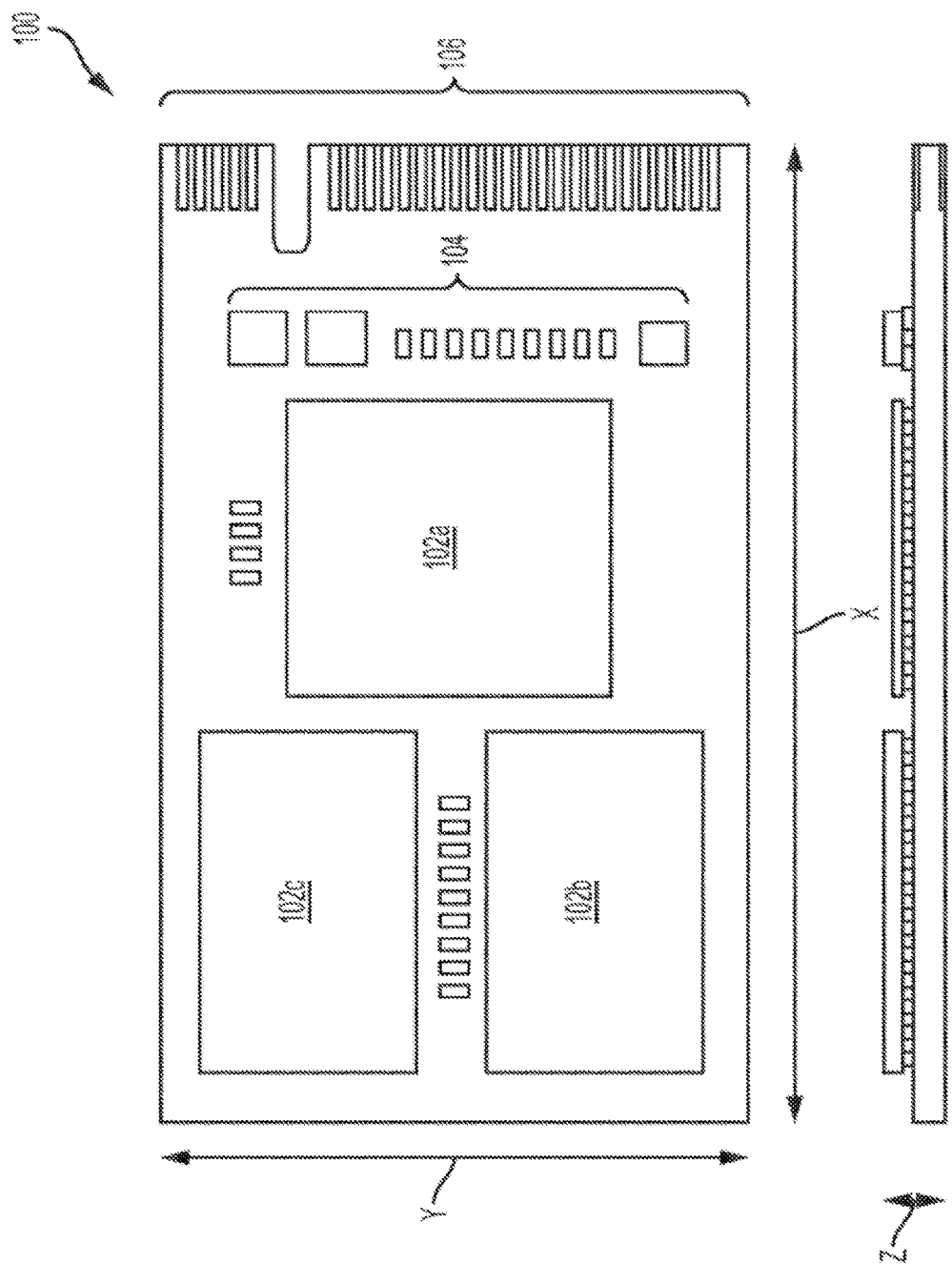
FIG. 1 is a schematic diagram of an edge card having a gum-stick form factor.
Figure 2A:
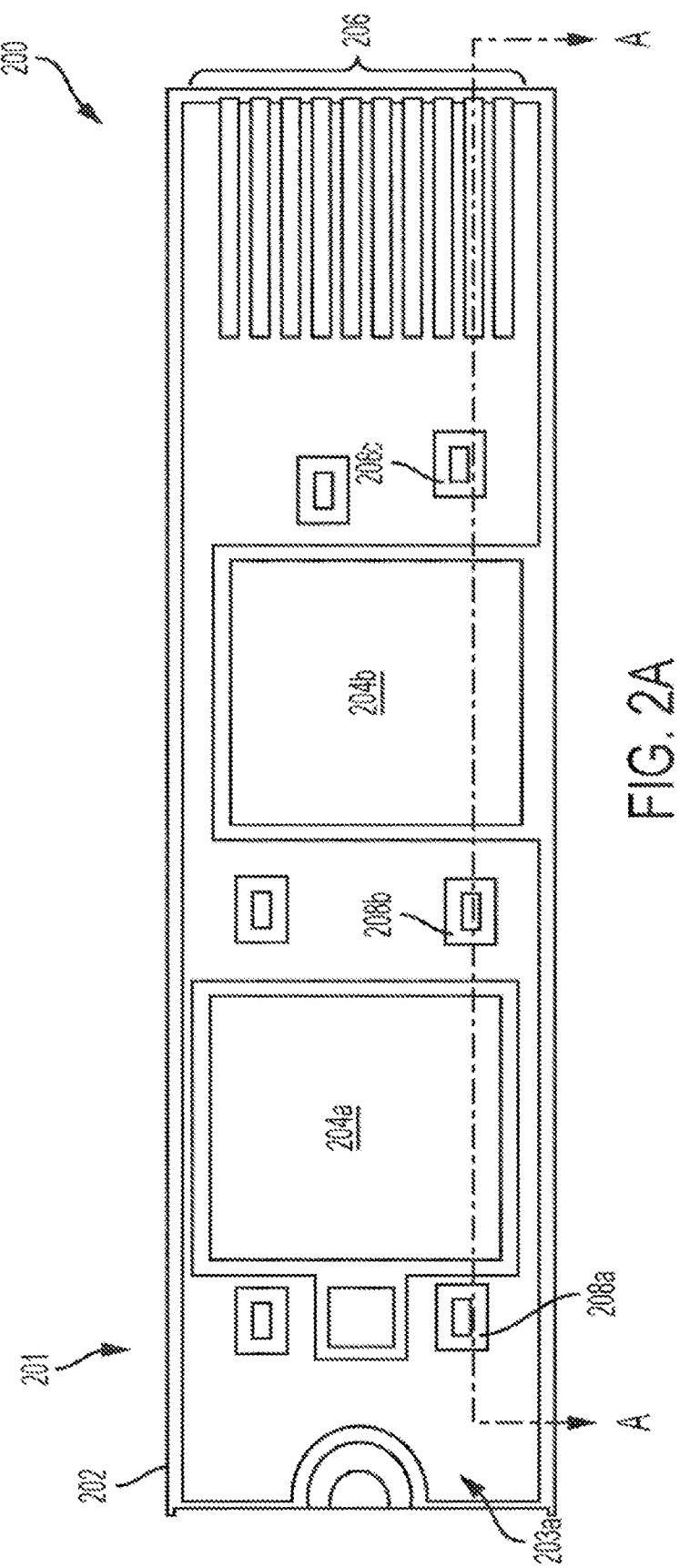
FIGS. 2A-B are a schematic illustration of an example edge card having a printed circuit board that includes a ball grid array substrate interposer.
Figure 2B:
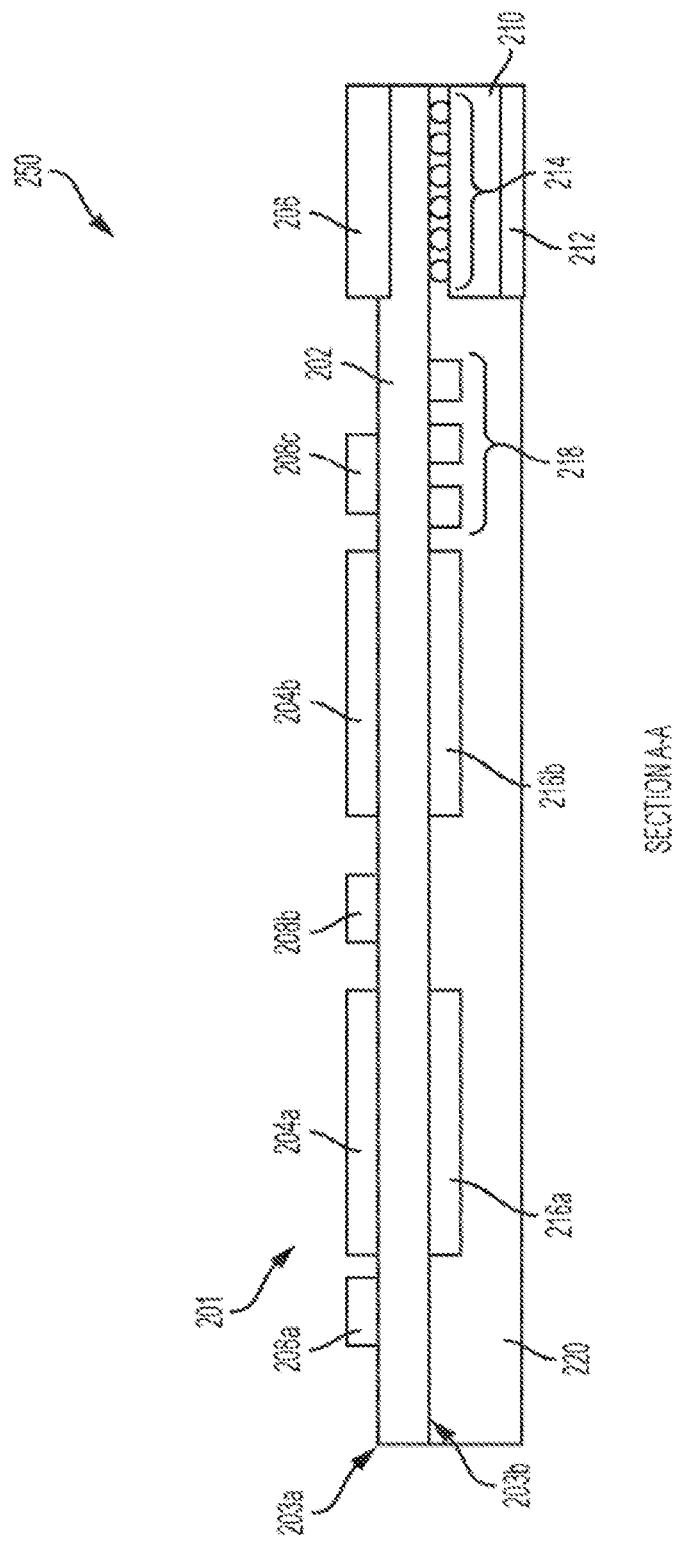

As an example, FIGS. 2A-B are a schematic illustration of an example edge card having a printed circuit board that includes a ball grid array substrate interposer. In FIG. 2A is a schematic diagram of a top side view 200 of an edge card 201 with a gum-stick form factor. The edge card 201 includes a printed circuit board 202 with a top side 203a. The edge card 201 includes circuit components 204a and 204b, which can be ASICs, DRAM, other memory elements, etc. The edge card 201 also includes passive circuit components 208a, 208b, and 208c. The edge card 201 can also include a plurality of metal contact fingers 206, which can electrically connect various circuit components to an edge connector.

FIG. 2B is a schematic diagram of a cross sectional view 250 through section A-A of the edge card 201 of FIG. 2A. The edge card 201 includes a PCB 202 that has a top side 203a, as mentioned before, and a bottom side 203b. The edge card 201 includes circuit components on the bottom side 203b, such as components 216a and 216b, which can be memory elements, DRAM, ASIC packages, etc. The bottom side 203b also includes passive components 218. A mold compound 220 can be used to encapsulate and to secure bottom side components to the bottom side 203b of the PCB 202.

The edge card 201 also includes an interposer 210 that can facilitate electrically connections between metal contact fingers 212 and the bottom side circuit components (e.g., components 216a-b and 218). The interposer 210 includes a ball grid array (BGA) 214 that electrically connects the metal contact fingers 212 to traces on the PCB 202.

Figure 3A:
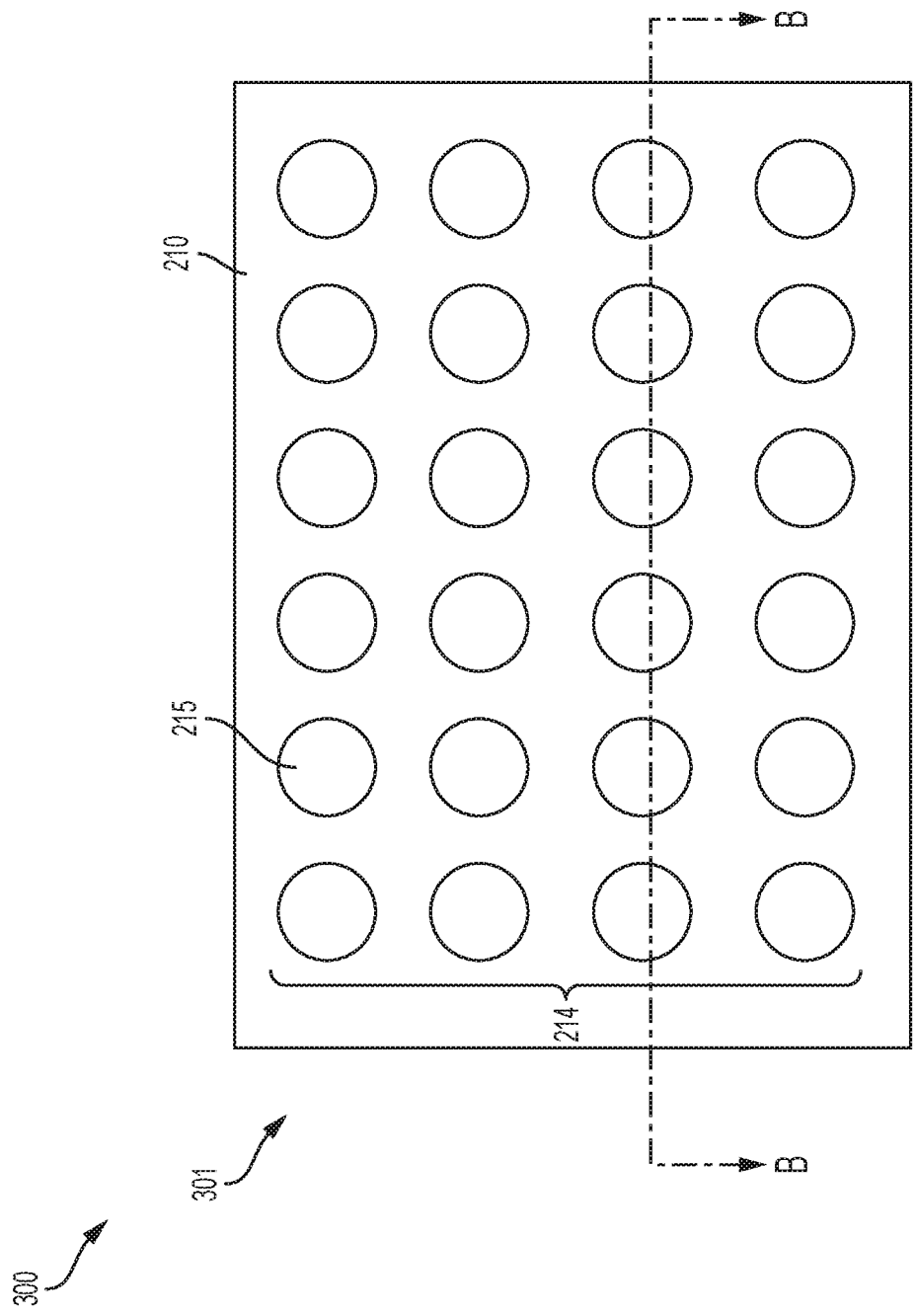

FIG. 3A is a schematic diagram of a top side view 300 of an example ball grid array substrate interposer 301. BGA substrate interposer 301 includes a substrate interposer 210 and a plurality of solder balls 215 that form a ball grid array 214. The solder balls 215 have a predetermined size. The BGA 214 has a predetermined pitch (e.g., distance between each solder ball 215), which can be based on the location of PCB traces on the PCB 202 of FIGS. 2A-B. FIG. 3B is a schematic diagram of a cross-sectional view 350 through section B-B of the example ball grid array substrate interposer 301. The BGA substrate interposer 301 includes a substrate interposer 210 and a BGA 214.

Figure 4A:
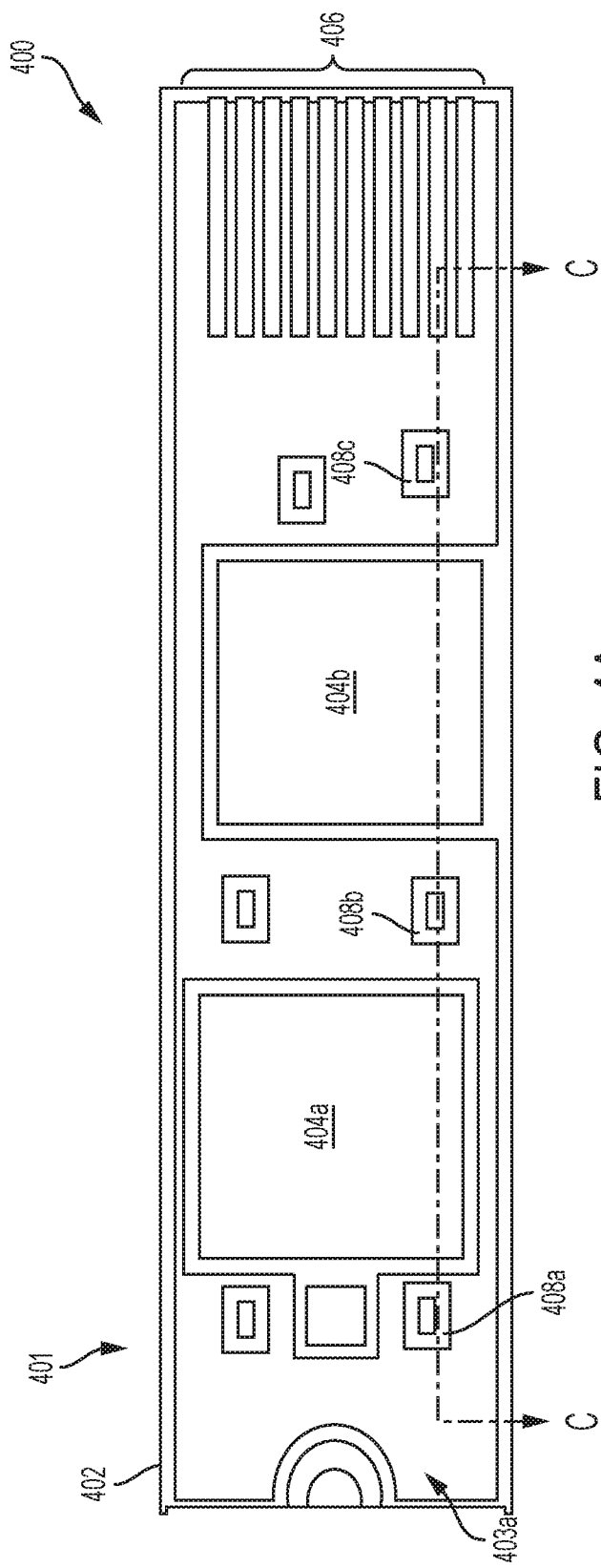
FIGS. 4A-B is a schematic diagram of an edge card that includes a ball grid array substrate interposer with embedded passive components in accordance with embodiments of the present disclosure.
Figure 4B:
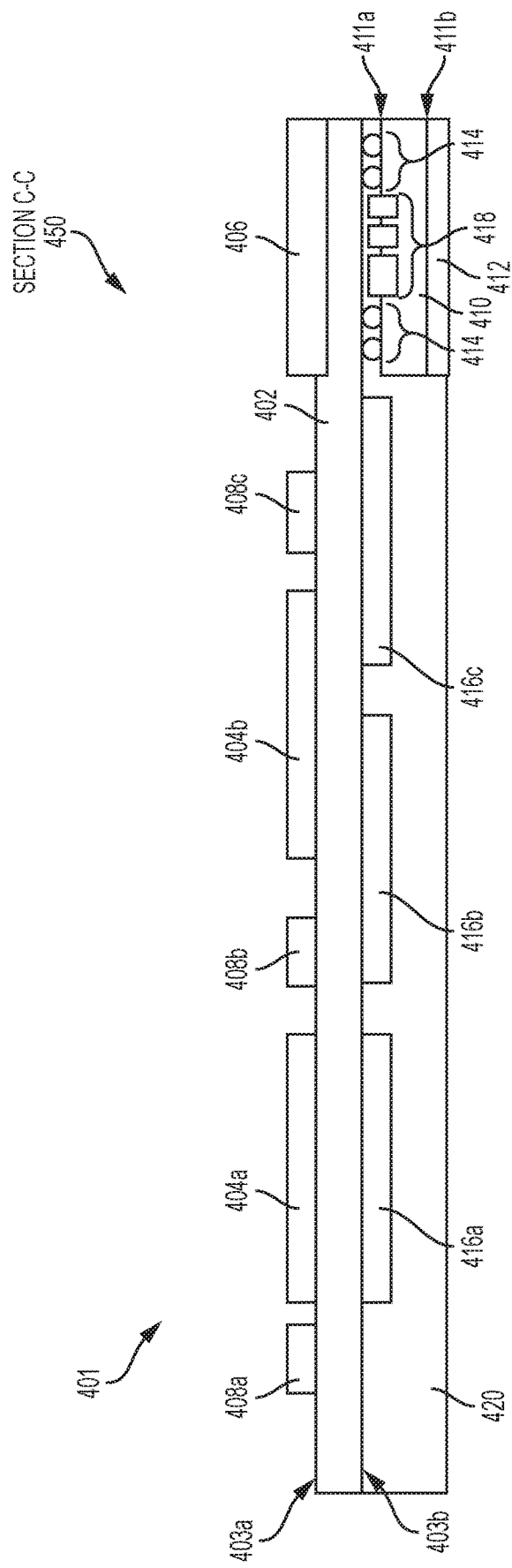

FIGS. 4A-B is a schematic diagram of an edge card that includes a ball grid array substrate interposer with embedded passive components in accordance with embodiments of the present disclosure. In FIG. 4A is a schematic diagram of a top side view 400 of an edge card 401 with a gum-stick form factor. The edge card 401 includes a printed circuit board 402 with a top side 403a. The edge card 401 includes circuit components 404a and 404b, which can be ASICs, DRAM, other memory elements, etc. The edge card 401 also includes passive circuit components 408a, 408b, and 408c. The edge card 401 can also include a plurality of metal contact fingers 406, which can electrically connect various circuit components to an edge connector.

FIG. 4B is a schematic diagram of a cross sectional view 450 through section B-B of the edge card 401 of FIG. 4A. The edge card 401 includes a PCB 402 that has a top side 403a, as mentioned before, and a bottom side 403b. The edge card 401 includes circuit components on the bottom side 403b, such as components 416a and 416b, which can be memory elements, DRAM, ASIC packages, etc. A mold compound 420 can be used to encapsulate and to secure bottom side components to the bottom side 403b of the PCB 402.

The edge card 401 also includes a substrate interposer 410 that can facilitate electrically connections between metal contact fingers 412 and the bottom side circuit components (e.g., components 416a-b and 418) and top-side circuit components. The substrate interposer 410 includes a ball grid array (BGA) 414 on a top side 411a of the substrate interposer 410 that electrically connects the metal contact fingers 412 on a bottom side 411b of the substrate interposer 410 to traces on the PCB 402. The substrate interposer 410 also includes one or more passive electrical components 418 embedded in a top side 411a of the substrate interposer 410. The one or more passive electrical components 418 can be electrically connected to traces in the substrate interposer 410 that can connect the one or more passive components 418 to other circuit elements through solder balls and/or through metal contact fingers 412. The substrate interposer 410 is described in more detail in FIGS. 5A-B. The edge card 401 also includes at least one additional active component 416c, which can be placed in a free space on the bottom side 403b of PCB 402 that is made available by moving passive components 418 to the substrate interposer 410.

Figure 5A:
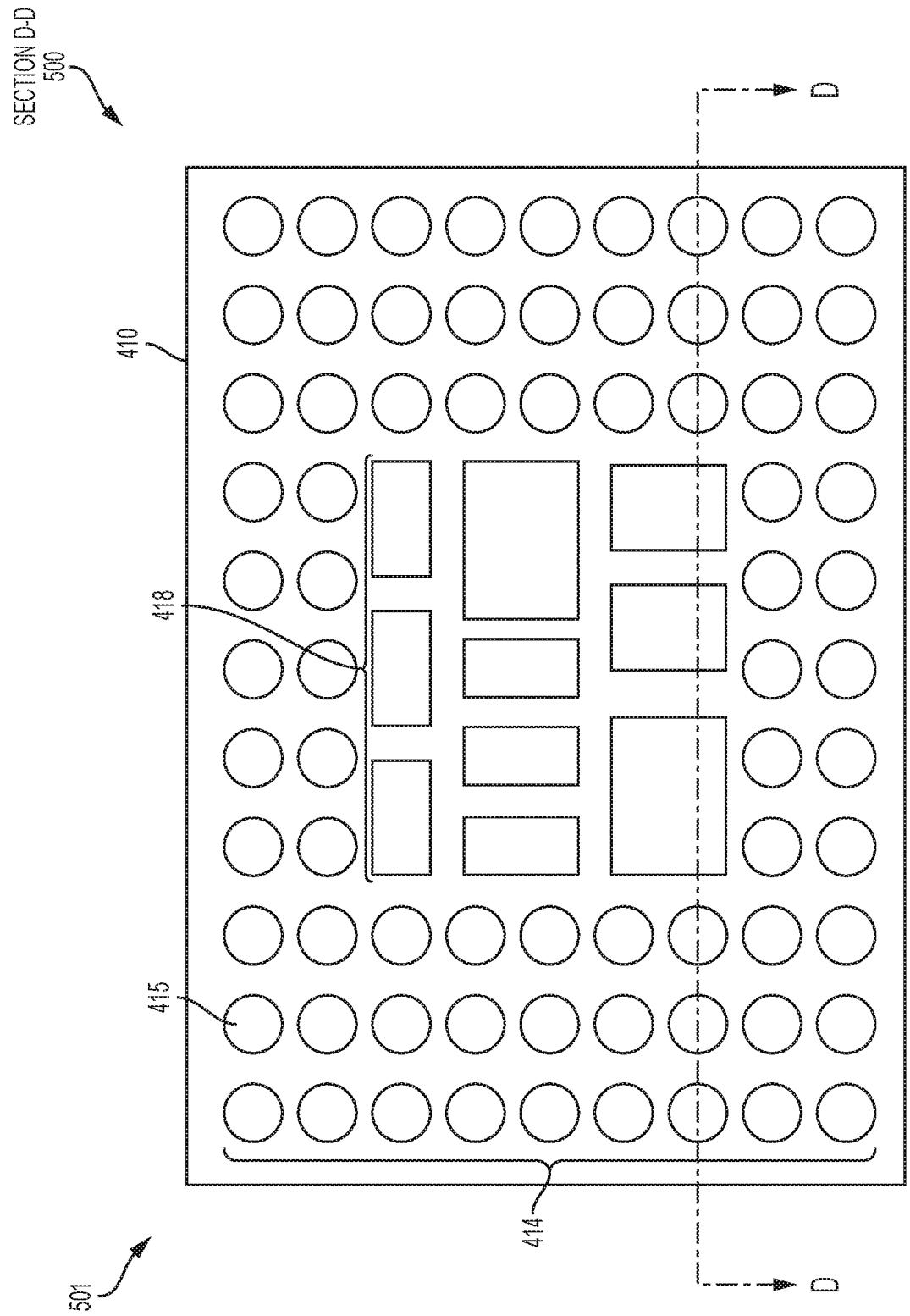
FIGS. 5A-B is a schematic diagram of an example ball grid array substrate interposer with embedded passive components in accordance with embodiments of the present disclosure.
Figure 5B:
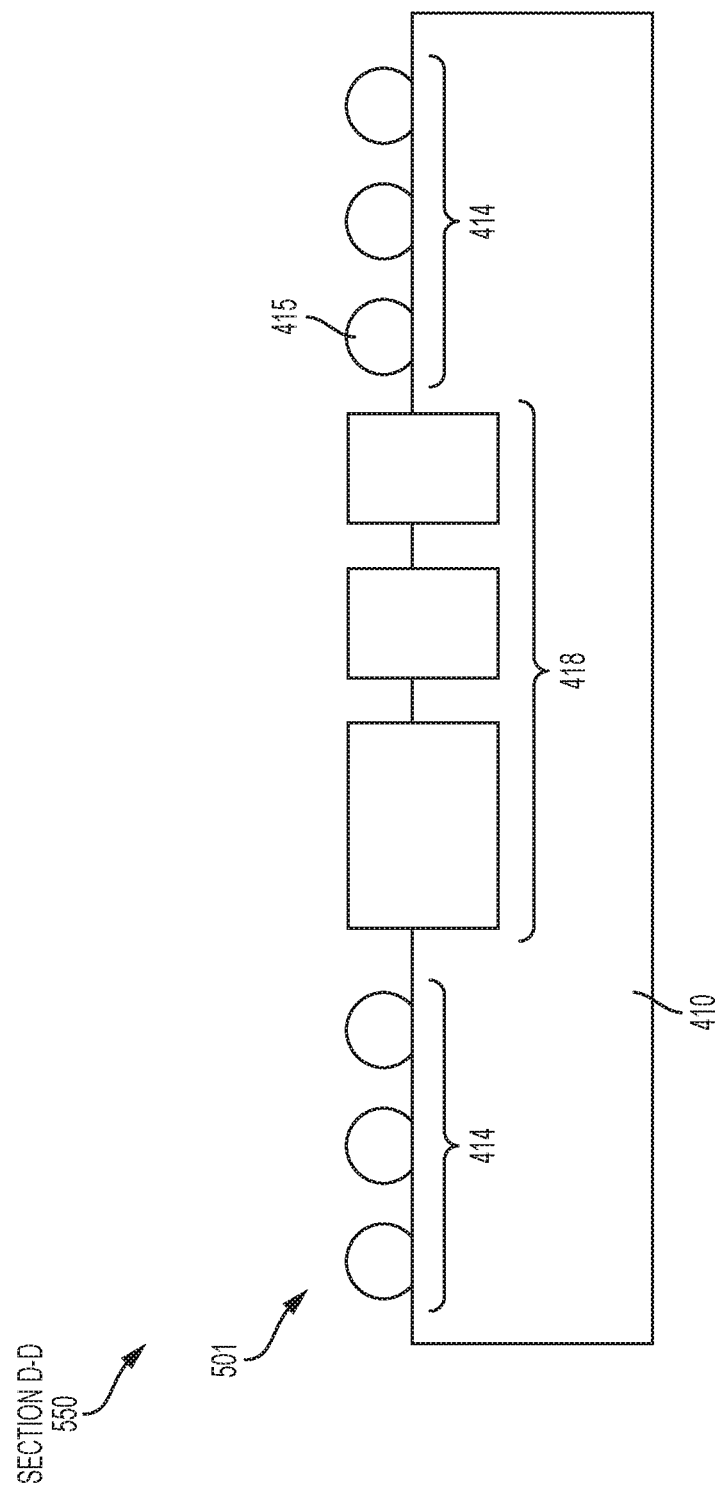

FIGS. 5A-B is a schematic diagram of an example ball grid array substrate interposer with embedded passive components in accordance with embodiments of the present disclosure. FIG. 5A is a schematic diagram of a top side view 500 of a substrate interposer 501 that includes a ball grid array in accordance with embodiments of the present disclosure. The substrate interposer 501 includes electrical passive components 418 that are embedded into a center region of the interposer 501. These electrical passives 418 can be the same passive components (or same type of passive components) from other regions of a small form factor (SFF) PCBA to which the interposer 501 is attached. For example, passive components 418 can be analogous to the passive components 218 that reside on the bottom side of the PCB 202 of edge card 201. The freed space on the SFF PCBA can then be utilized for other things like additional memory packages or other active devices, such as active device 416c of FIG. 4B.

In FIG. 5A, the BGA ball field 414 can be resized to have a smaller footprint on the BGA substrate interposer 410 to make an open area into which at least some of the bottom side passive components 418 can be embedded (i.e., into the substrate). Each solder ball 415 can have a decreased size and the BGA 414 can have a decreased pitch (e.g., from 0.6-0.8 mm to 0.4 mm pitch), to accommodate the passive components 418 in a middle area of the substrate interposer 410. Embedding the passive circuit components also allows for a lower total Z height of the BGA 414 and substrate interposer 410.

FIG. 5B is a schematic diagram of a cross-sectional view 550 of a substrate interposer 501 that includes a ball grid array in accordance with embodiments of the present disclosure. In FIG. 5B, the passive components 418 are shown as embedded into the substrate interposer 410. The solder ball 415 has a smaller size than solder ball 215. The ball grid array 414 has a smaller pitch than BGA 214 to accommodate the passive components 418.

Reducing the pitch of the BGA substrate ball field 414 opens available space so that passive components 418 can be moved from the bottom side 403b of the main substrate 402 and embedded into this open space on the BGA substrate 410.

Moving the passive components 418 to the substrate interposer 410 can make room on the bottom side 403b of the PCB 402 for more active circuit components 416c. Additionally, moving the passive circuit components 418 can also relocate heat sources away from active circuit components 416a-c.

Figure 5C:
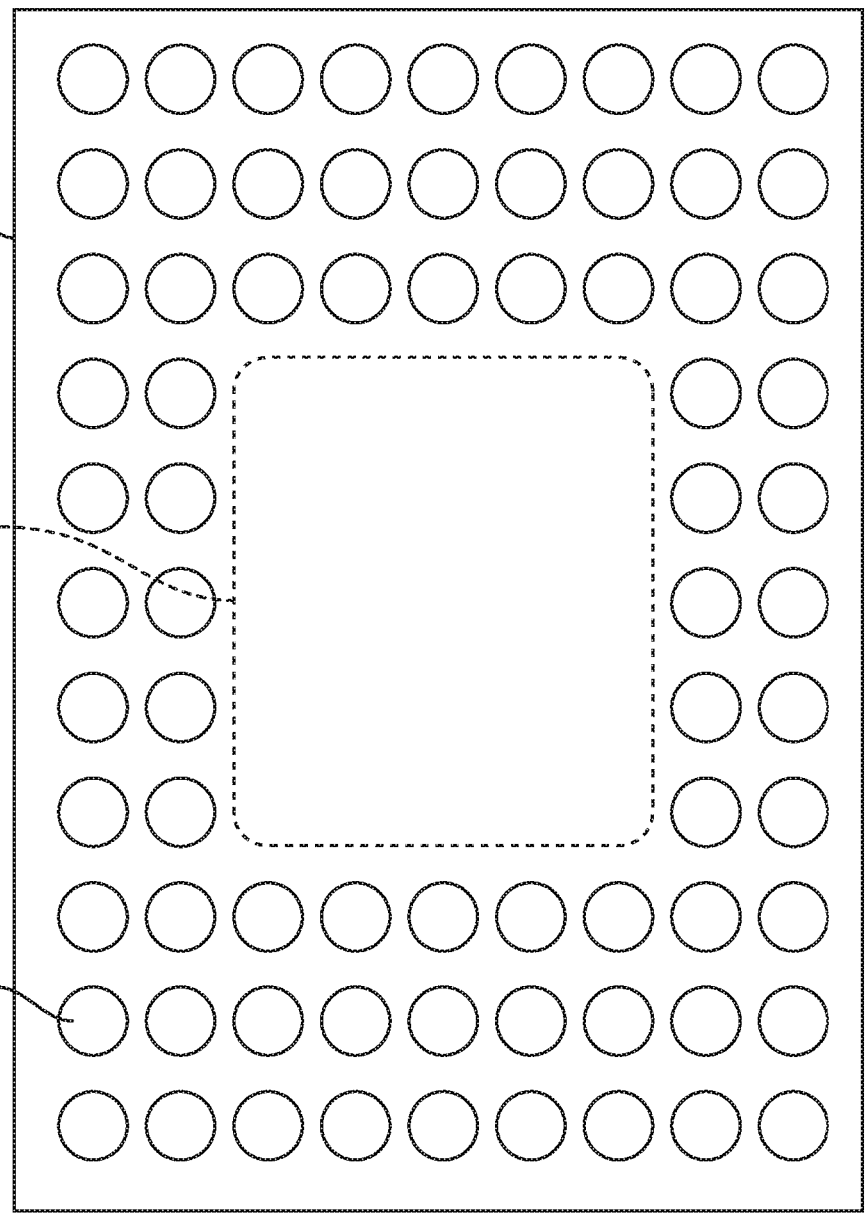
FIG. 5C is a schematic diagram of an example substrate interposer that includes a ball grid array surrounding a blank area in accordance with embodiments of the present disclosure.

FIG. 5C is a schematic diagram 560 of an example substrate interposer 561 that includes solder pads 564 surrounding a blank area 566 in accordance with embodiments of the present disclosure. The substrate interposer 561 shown in FIG. 5C includes a plurality of solder pads 564 onto which solder balls can be formed, thereby forming a ball grid array. The plurality of solder pads 564 surrounds a blank area 566. Embedded within the substrate interposer PCB layers are embedded solder pads (not shown here, but shown schematically in FIGS. 6A-F and FIG. 7). The blank area 566 defines an area that can be milled or laser cut or otherwise removed to expose the embedded solder pads. The embedded solder pads, once exposed, can receive passive circuit components, such as those shown in FIGS. 5A-B.

Figure 6A:
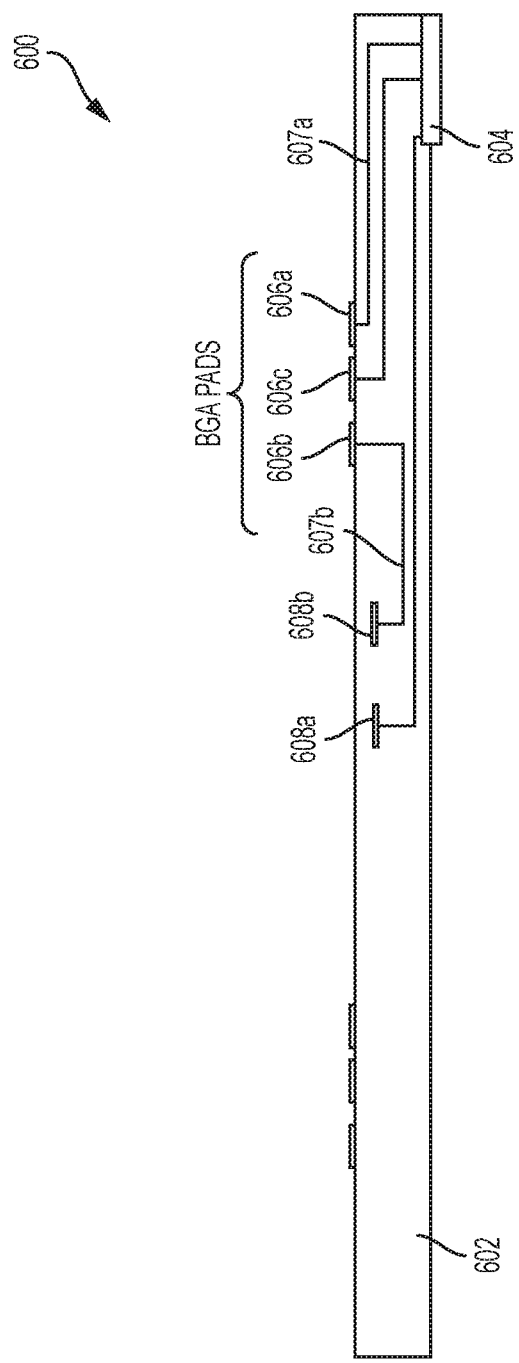

FIGS. 6A-F are schematic diagrams of a process for forming an edge card with a substrate interposer in accordance with embodiments of the present disclosure. In FIG. 6A, a printed circuit board (PCB) 602 that can be the basis of a substrate interposer is provided (600). The PCB 602 is a trace and via routed PCB with plated gold fingers on a bottom side and ball grid array pads (solder pads) on a topside. The ball grid array pads surround a blank area (such as the blank area 566 of FIG. 5C) on the top side of the PCB 602. Each ball grid array pad can be electrically connected by a metal trace. For example, top-side solder pad 606a can be electrically connected to a metal contact finger through a trace 607a. Embedded in the PCB and in locations under the blank area are embedded solder pads, such as solder pads 608a and 608b. Embedded solder pad 608b can be electrically connected to a top-side solder pad 606b by a trace 607b. In some embodiments, solder pads 608a and 608b can be contact vias instead of metal landing pads. Contact vias can be open passages that allow for leads on the passives to make contact with underlying traces and can be large enough to receive the leads and also allow for some solder reflow during a soldering process. FIG. 7 illustrates an example contact via 705 as an example embodiment. Though shown as having two embedded solder pads 608a and 608b, it is understood that more embedded solder pads can be embedded in the PCB 602.

Figure 6B:
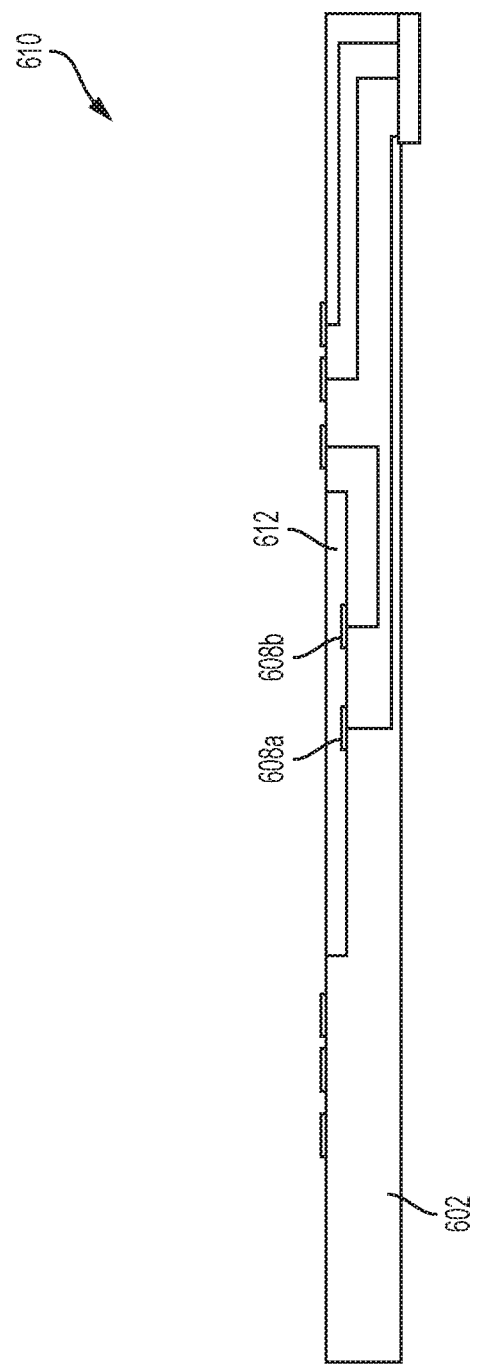
Figure 7:
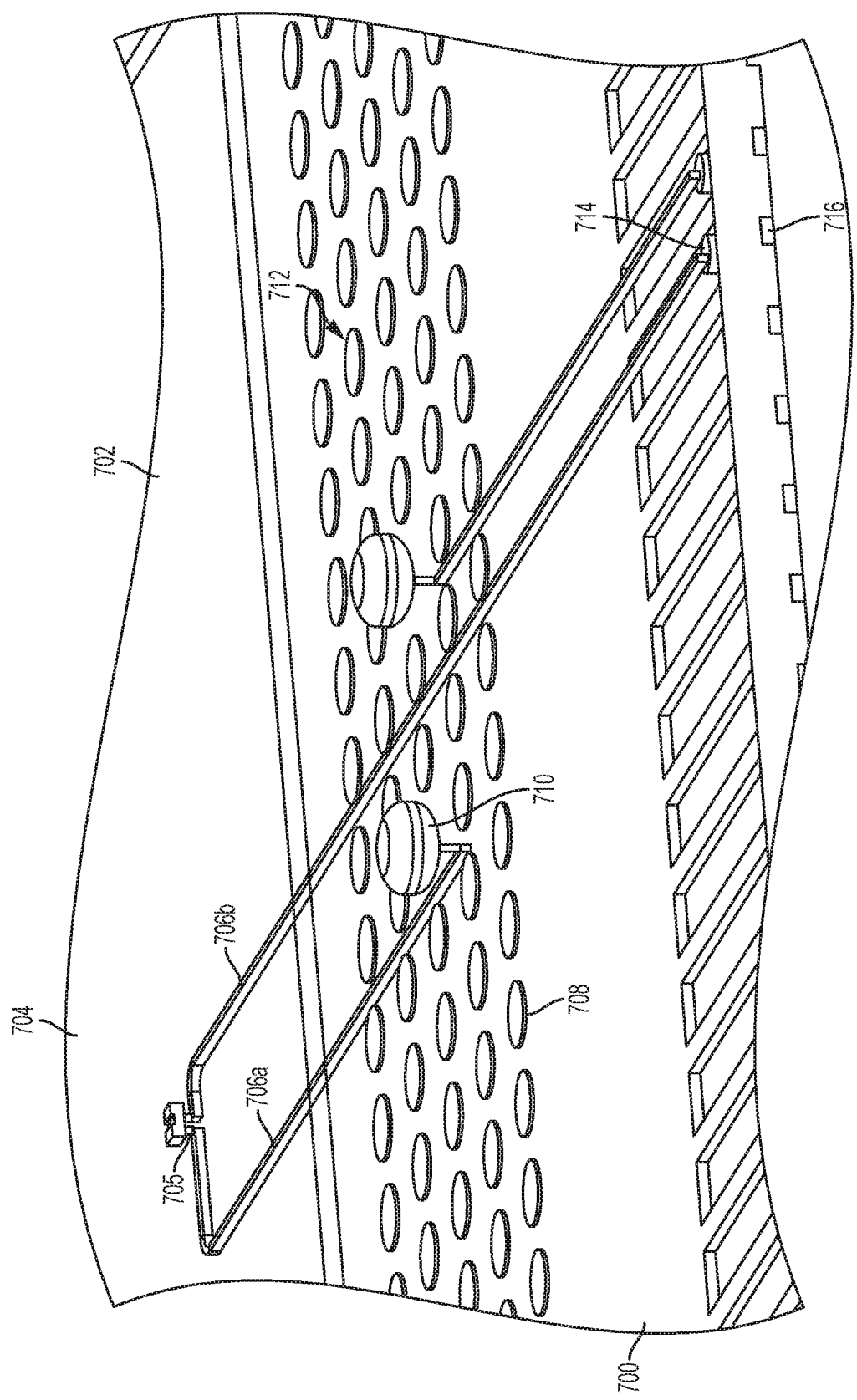
FIG. 7 is a schematic diagram of an isometric view of a substrate interposer in accordance with embodiments of the present disclosure.

In FIG. 6B, at least a portion of the blank area on the top side of the PCB 602 is removed from the PCB 602 to form a pocket or a depression 612 in the top side of the PCB 602 (610). For example, the blank area on the top side of the PCB 602 can be milled down to a predetermined depth to expose the embedded solder pads 608a and 608b. In some embodiments, a laser can be used to cut the blank area. In some embodiments, a laser can detect the metal of the solder pads 608a and 608b and cut off automatically based on the detection of the metal or wavelength of the laser.

Figure 6C:
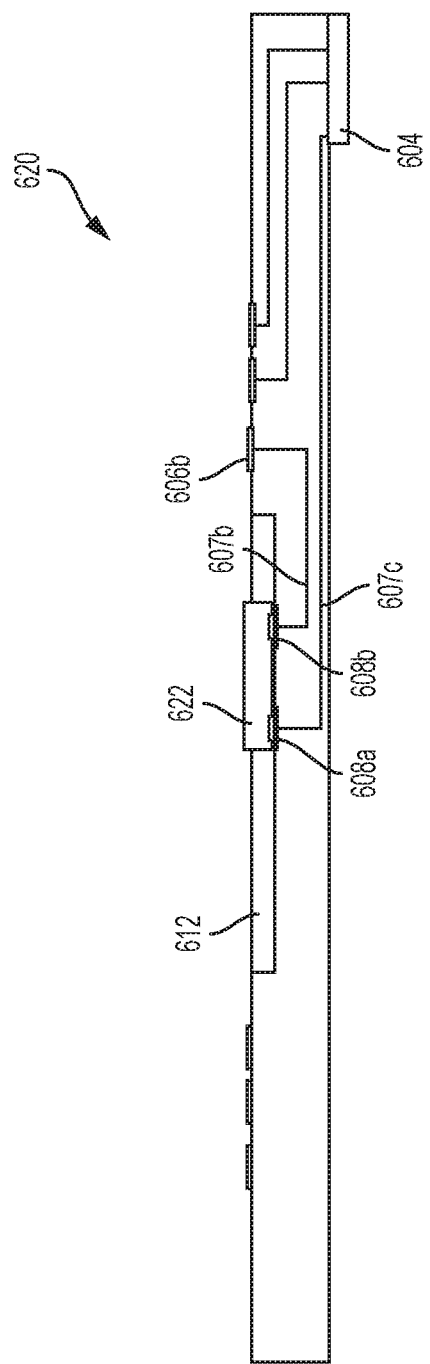

In FIG. 6C, a passive circuit component 622 is placed onto the embedded solder pads 608a and 608b (620). The passive circuit component 622 can be placed onto the embedded solder pads 608a and 608b through surface mount technology (SMT) via pick-and-place techniques. The circuit component 622 can be soldered to embedded solder pads 608a and 608b through a solder operation. The passive circuit component 622 can be electrically connected to, for example, a metal contact finger through a trace 607c that is electrically connected to the exposed embedded solder pad 608a. The passive circuit component 622 can also be connected to a top-side solder pad 606b through a trace 607b. The metal contact finger allows the passive circuit component 622 to be electrically connected to circuit elements on a different PCB or power source etc. The top side trace 607b allows the passive circuit component 622 to be electrically connected to circuit elements on a main PCB (as shown in FIGS. 6E-F). The depression 612 can allow for passive circuit components to be placed onto the solder pads 608a and 608b for making electrical connections to the traces; additionally, the depression 612 is deep enough to accommodate the height (or at least a portion of the total height) of the passive circuit components so that the substrate interposer can be electrically and mechanically connected to a bottom side of a main PCB (shown in FIGS. 6E-F) without the passive circuit components hitting the bottom side of the main PCB and without having to increase the size of each solder ball to create an offset. It is understood that a single passive circuit component is shown for illustrative purposes, but many passive circuit components can be placed onto a plurality of exposed embedded solder pads.

Figure 6D:
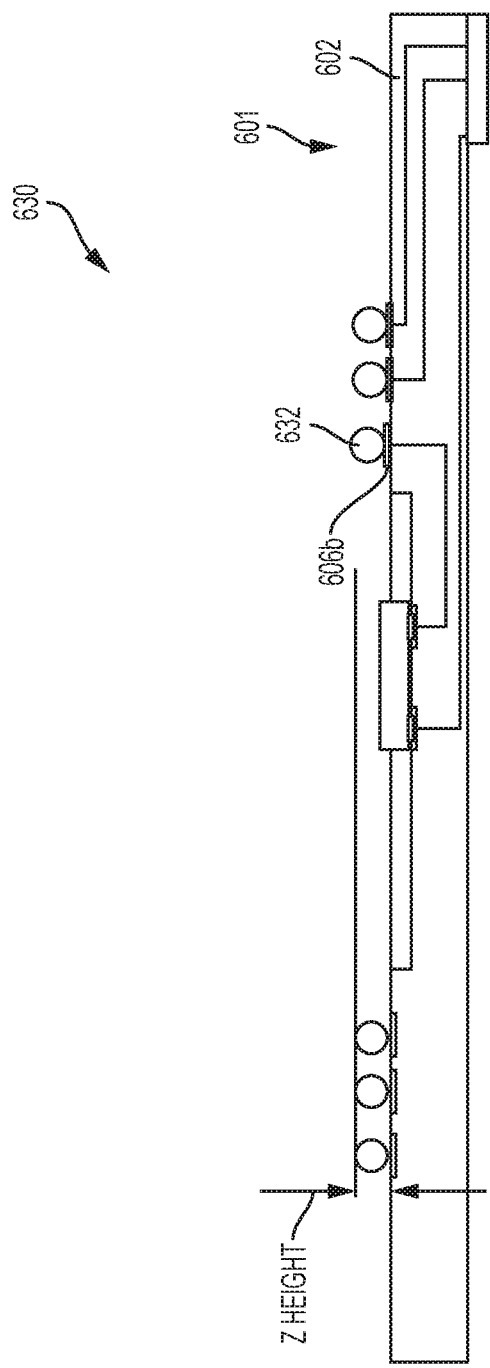

In FIG. 6D, a plurality of solder balls are formed onto the top-side solder pads, forming a ball grid array on the top side of the PCB 602 (630). For example, solder ball 632 can be formed on solder pad 606b. The solder pad 606b has a predetermined size and pitch, which results in a ball grid array having a corresponding solder ball size and pitch. The solder ball size is determined so as to allow for a predetermined number of solder balls needed for all electrical connections contemplated by the circuits onto a reduced available area. The available area is reduced due to the blank space and resulting pocket for accommodating the passive circuit components. The solder ball size is also controlled to be large enough to make an electrical and mechanical connection to a bottom side of a main PCB while also leaving room for the passive circuit components (i.e., the solder ball 632 has a higher Z height than the passive components). Once the solder balls 632 are formed on the top side of the PCB 602, the resulting apparatus can be referred to as a substrate interposer 601, for the purposes of this disclosure.

In FIG. 6E, the substrate interposer 601 is attached to the main PCB 641 (640). The substrate interposer 601 is soldered onto the bottom side of the main PCB 641 using the solder balls 632. The solder balls 632 can be soldered onto a solder pad 642b on a bottom side of the main PCB 641. The main PCB solder pad 642b can be electrically connected by trace 646b to a top-side solder pad 649b that interfaces with a top-side circuit element 648. Main PCB solder pad 642a can also connect substrate interposer solder balls to a metal contact finger 644 on the edge of the PCB 641, and metal contact finger 644 can be electrically connected to a top-side solder pad 649a via trace 646c. Top-side circuit element 648 can be an active circuit element (e.g., an integrated circuit package, ASIC, memory element, etc.) or a passive circuit element.

The soldering of the solder balls 632 to the bottom-side solder pads 642a-b on the main PCT 641 can create an electrical connection between circuit elements of the substrate interposer 601 and circuit elements of the main PCB 641. Additionally, soldering can create a mechanical connection between the substrate interposer 601 and the main PCT 641. Stress on this mechanical connection, however, can compromise electrical connectivity and can compromise the mechanical connection itself. In FIG. 6F, an encapsulating material 652 is introduced to the bottom of the main PCB 641, resulting in edge card 651 (650). The encapsulating material can be a thermoset plastic that is introduced via a transfer mold or compression mold process wherein the PCB assembly with interposer is encased in a mold and the thermoset plastic is introduced such that it flows where desired. Special processes are applied (such as masking) to keep the thermoset off of the gold fingers. The encapsulating material can cover the bottom-side of the main PCB 641 and can encapsulate both a top side and a bottom side of the substrate interposer 601. The encapsulating material can be formed such that the metal contact fingers 604 are exposed, while the remainder of the substrate interposer is encapsulated. The encapsulating material 652 can provide protection to the substrate interposer circuitry, and can also provide mechanical reinforcement and stability for the substrate interposer 601. For example, the substrate interposer 601 would no longer be suspended and supported solely by the solder joints. The encapsulating material 652 can provide structural support for the substrate interposer 601. Though not shown in FIG. 6F, the encapsulating material 652 covers the entire bottom side of the main PCB 641, which is shown in FIG. 4B (as mold compound 420).

FIG. 7 is a schematic diagram of an isometric view of a substrate interposer 700 in accordance with embodiments of the present disclosure. FIG. 7 illustrates an example trace routing in the substrate interposer 700. The substrate interposer top side includes a plurality of top-side solder pads 708 patterned around a PCB depression 702. A solder ball 710 can be formed on each solder pad 708. The top-side solder pads 708 have a size and pitch to support a solder ball grid array 712.

FIG. 7 illustrates embedded traces 706a and 706b. In this example, the embedded traces are shown for illustrative purposes, but it understood that the traces are embedded in the PCB layering. The trace 706a electrically connects solder ball 710 with a passive circuit component 704 through a via 705. The trace 706b electrically connects the passive circuit component 704 with a metal finger contact 716 through a via 714.

Figure 8:
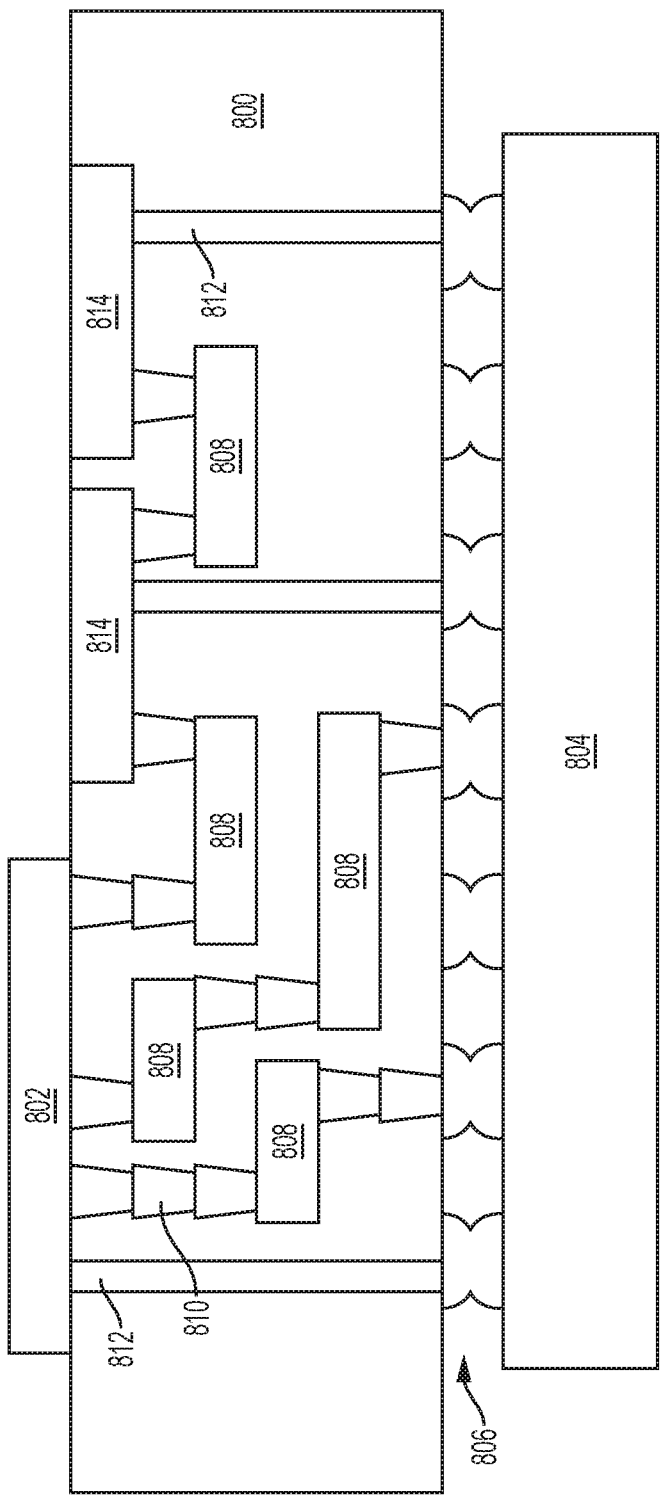
FIG. 8 is a schematic diagram of an interposer implementing one or more embodiments of the present disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800.

In accordance with embodiments of the disclosure, apparatuses or processes disclosed herein may be used in the fabrication of interposer 800.

Figure 9:
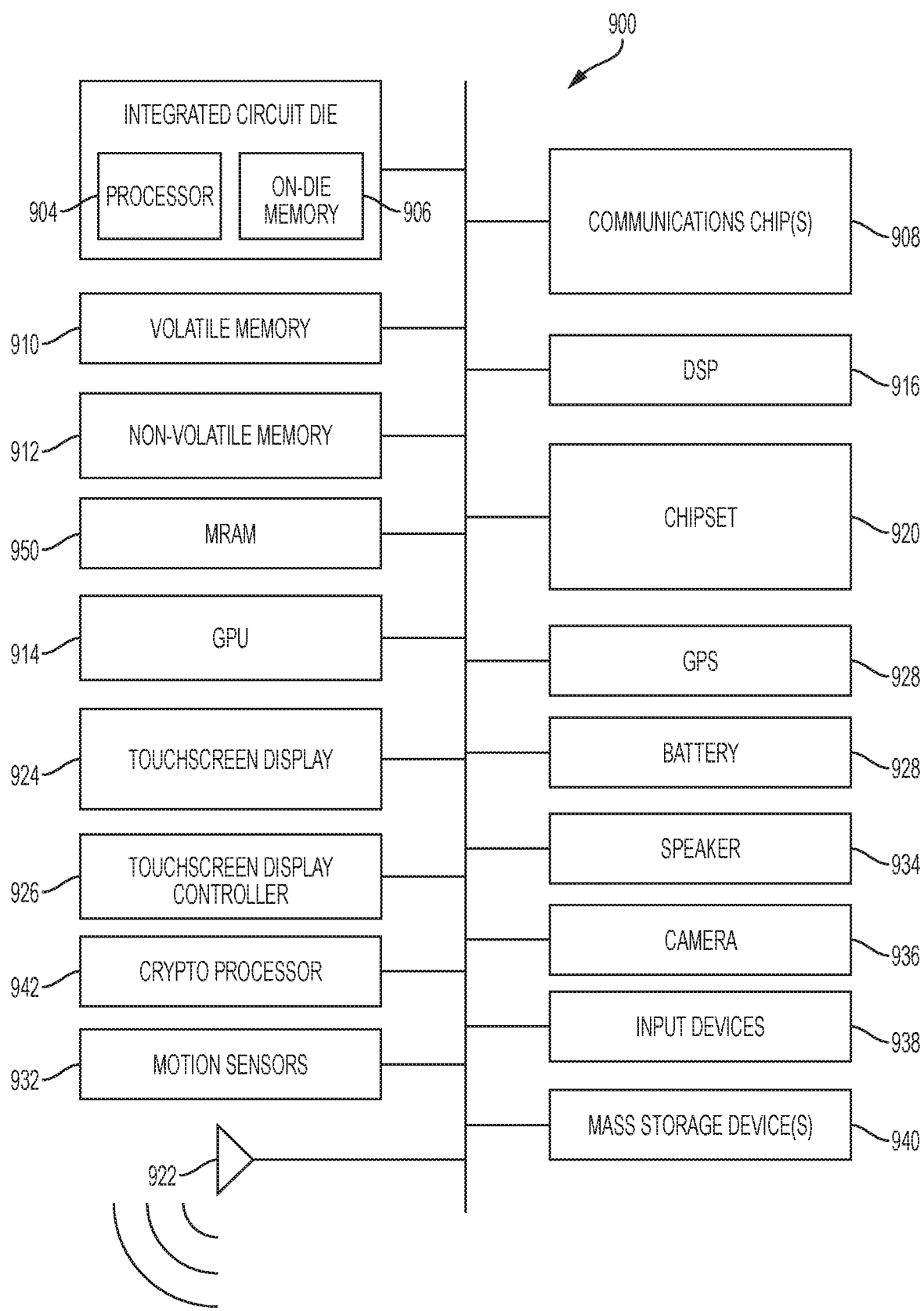
FIG. 9 is a schematic diagram of an example computing device that may connected via a linear edge connector.

FIG. 9 illustrates a computing device 900 in accordance with one embodiment of the disclosure. The computing device 900 may include a number of components. In one embodiment, these components are attached to one or more motherboards. In an alternate embodiment, some or all of these components are fabricated onto a single system-on-a-chip (SoC) die. The components in the computing device 900 include, but are not limited to, an integrated circuit die 902 and at least one communications logic unit 908. In some implementations the communications logic unit 908 is fabricated within the integrated circuit die 902 while in other implementations the communications logic unit 908 is fabricated in a separate integrated circuit chip that may be bonded to a substrate or motherboard that is shared with or electronically coupled to the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STT-MRAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 928 or other power source, a power amplifier (not shown), a voltage regulator (not shown), a global positioning system (GPS) device 929, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications logic unit 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communications logic units 908. For instance, a first communications logic unit 908 may be dedicated to shorter range wireless communications such as Wi-Fi and Bluetooth and a second communications logic unit 908 may be dedicated to longer range wireless communications such as GPS, EDGE, GPRS, CDMA, WiMAX, LTE, Ev-DO, and others.

In various embodiments, the computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The relative sizes of features shown in the figures are not drawn to scale.

The following paragraphs provide examples of various ones of the embodiments disclosed herein.

Example 1 an edge card that includes a printed circuit board comprising a top side and a bottom side. The top side of the printed circuit board includes one or more top-side circuit components, and a plurality of top-side metal contact fingers, at least some of the top-side metal contact fingers electrically connected to at least one of the one or more circuit components. The bottom side of the printed circuit board includes one or more bottom-side circuit components; and a substrate interposer comprising a top side and a bottom side. The top side of the substrate interposer includes one or more passive circuit components at least partially embedded in the substrate interposer, and one or more solder balls arranged around the one or more passive circuit components. The bottom side of the substrate interposer comprising one or more bottom-side metal contact fingers, the at least one of the bottom-side metal contact fingers electrically connected to at least one of the solder balls.

Example 2 may include the subject matter of example 1, wherein the substrate interposer includes a printed circuit board with a plurality of routed traces embedded in the printed circuit board, at least one routed trace electrically connecting a bottom-side metal contact finger to an embedded passive circuit component.

Example 3 may include the subject matter of any of examples 1-2, wherein the bottom side circuit components can include active circuit components.

Example 4 may include the subject matter of any of examples 1-3, wherein active circuit components can include one or more of an application specific integrated circuit (ASIC) or a memory package.

Example 5 may include the subject matter of any of examples 1-4, wherein the bottom side of the printed circuit board can also include one or more traces electrically connecting the bottom-side circuit components to the one or more solder balls.

Example 6 may include the subject matter of any of examples 1-5, wherein the substrate interposer can include a metal trace electrically connecting the one or more passive circuit components to one or both of the top-side circuit components or the bottom-side circuit components.

Example 7 may include the subject matter of any of examples 1-6, can also include a mold compound on the bottom side of the printed circuit board, the mold compound configured to secure the bottom-side circuit components and the substrate interposer onto the bottom side of the printed circuit board.

Example 8 may include the subject matter of any of examples 1-7, wherein the bottom side of the printed circuit board also includes a cavity, and wherein at least one of the passive circuit components that is embedded in the substrate interposer resides in the cavity.

Example 9 is a substrate interposer that includes a substrate having a top side and a bottom side. The top side of the substrate comprises one or more passive circuit components embedded at least partially into the top side of the substrate, and a solder ball field on the top side of the substrate, the solder ball field comprising one or more solder balls located around the one or more passive circuit components.

Example 10 may include the subject matter of example 9, wherein the bottom side of the substrate includes one or more metal contact fingers electrically connected to the at least one of the solder balls on the top side of the substrate interposer.

Example 11 may include the subject matter of example 10, and can also include a metal trace embedded in the substrate interposer and electrically connecting the one or more passive circuit components to one or both of the one or more solder balls or the one or more metal contact fingers.

Example 12 may include the subject matter of any of examples 9-11, wherein the one or more solder balls can include a diameter of substantially 0.3 millimeters.

Example 13 may include the subject matter of any of examples 9-12, wherein the solder ball field can include a pitch of substantially 0.4 millimeters.

Example 14 may include the subject matter of any of examples 9-13, wherein the one or more passive circuit components can include one or more of a resistor, a capacitor, or an inductor.

Example 15 may include the subject matter of any of examples 9-14, wherein the one or more passive circuit components is at least partially embedded in the top side of the substrate interposer to a depth within the substrate interposer so that a top side of the one or more passive circuit components is lower than a top side of the one or more solder balls.

Example 16 is a method for forming an edge card, the method including providing a printed circuit board for a substrate interposer, the printed circuit board comprising metal contact fingers proximate an edge of a bottom side of the printed circuit board, one or more solder pads embedded within the printed circuit board, one or more metal traces electrically connecting at least some of the metal contact fingers to at least some of the solder pads embedded within the printed circuit board; and one or more solder pads on a top side of the printed circuit board, wherein the one or more solder pads on the top side of the printed circuit board surrounding a blank area on the printed circuit board. The method also includes exposing the embedded solder pads; placing a passive circuit component onto at least some of the exposed embedded solder pads; and forming solder balls on each of the one or more solder pads on the top side of the printed circuit board.

Example 17 may include the subject matter of example 16, wherein exposing the embedded solder pads can include forming a depression in the blank area of the top side of the printed circuit board.

Example 18 may include the subject matter of example 17, wherein forming the depression can include one of milling or laser cutting the blank area on the top side of the printed circuit board to expose the embedded solder pads.

Example 19 may include the subject matter of any of examples 16-19, wherein the printed circuit board is a substrate interposer, and the method further can include solder mounting the substrate interposer to a bottom side of a second printed circuit board comprising one or more integrated circuit packages.

Example 20 may include the subject matter of any of examples 19, wherein the second printed circuit board can include one or more solder pads on a bottom side of the second printed circuit board, and wherein solder mounting the substrate interposer to the second printed circuit board can include soldering the substrate interposer to the second printed circuit board creating a solder ball connection between the one or more solder pads on the bottom side of the second printed circuit board and the one or more solder balls on the top side of the substrate interposer.

Example 21 may include the subject matter of any of examples 19-20, further comprising forming an encapsulant on the bottom side of the second printed circuit board, the encapsulant encapsulating at least a portion of the top side and the bottom side of the substrate interposer, wherein the metal contact fingers of the substrate interposer are not encapsulated.

Example 22 may include the subject matter of any of examples 19-21, wherein the second printed circuit board can include a metal trace embedded in the second circuit board electrically connected to a solder pad on the bottom side of the second printed circuit board, the trace electrically connecting a passive circuit components on the substrate interposer with an integrated circuit packages on the second printed circuit board through a ball connections.

Example 23 may include the subject matter of any of examples 16-22, wherein placing a passive circuit component onto at least some of the exposed embedded solder pads can include picking and placing the passive circuit components onto at least some of the exposed embedded solder pads.

Example 24 is a computing device that includes a processor mounted on a substrate; a communications logic unit within the processor; a memory within the processor; a graphics processing unit within the computing device; an antenna within the computing device; a display on the computing device; a battery within the computing device; a power amplifier within the processor; and a voltage regulator within the processor. The computing device also can include an edge card. The edge card can include a printed circuit board comprising a top side and a bottom side. The top side of the printed circuit board can include one or more top-side circuit components, and a plurality of top-side metal contact fingers, at least some of the top-side metal contact fingers electrically connected to at least one of the one or more circuit components. The bottom side of the printed circuit board can include one or more bottom-side circuit components; and a substrate interposer can include a top side and a bottom side. The top side of the substrate interposer can include one or more passive circuit components at least partially embedded in the substrate interposer, and one or more solder balls arranged around the one or more passive circuit components. The bottom side of the substrate interposer can include one or more bottom-side metal contact fingers, the at least one of the bottom-side metal contact fingers electrically connected to at least one of the solder balls.

Example 25 may include the subject matter of example 24, wherein the bottom side circuit components can include active circuit components.

Example 26 may include the subject matter of example 25, wherein active circuit components comprise one or more of an application specific integrated circuit (ASIC) or a memory package.

Example 27 may include the subject matter of any of examples 24-26, wherein the bottom side of the printed circuit board can include one or more traces electrically connecting the bottom-side circuit components to the one or more solder balls.

Example 28 may include the subject matter of any of examples 24-27, wherein the substrate interposer can include a metal trace electrically connecting the one or more passive circuit components to one or both of the top-side circuit components or the bottom-side circuit components.

Example 29 may include the subject matter of any of examples 24-28, and can also include a mold compound on the bottom side of the printed circuit board, the mold compound configured to secure the bottom-side circuit components and the substrate interposer onto the bottom side of the printed circuit board.

Example 30 may include the subject matter of any of examples 24-29, wherein the bottom side of the printed circuit board can include a cavity, and wherein at least one of the passive circuit components that is embedded in the substrate interposer resides in the cavity.

What is claimed is:
1. An edge card, comprising:
a printed circuit board having a top side and a bottom side;
one or more top-side circuit components on the top side of the printed circuit board;
a plurality of top-side metal contact fingers on the top side of the printed circuit board, at least some of the top-side metal contact fingers electrically connected to at least one of the one or more circuit components;
one or more bottom-side circuit components on the bottom side of the printed circuit board;
an interposer having a top side and a bottom side;
one or more passive circuit components at the top side of the interposer, one or more solder balls arranged around the one or more passive circuit components, wherein the top side of the interposer is coupled to the bottom side of the printed circuit board by at least some of the solder balls; and
one or more bottom-side metal contact fingers, the at least one of the bottom-side metal contact fingers electrically connected to at least one of the solder balls.

2. The edge card of claim 1, wherein the interposer includes a plurality of traces, and at least one trace electrically connects a bottom-side metal contact finger to one or more of the passive circuit components.

3. The edge card of claim 1, wherein the bottom-side circuit components include active circuit components.

4. The edge card of claim 3, wherein the active circuit components include one or more of an application specific integrated circuit (ASIC) or a memory package.

5. The edge card of claim 1, wherein the printed circuit board includes one or more traces electrically connecting the bottom-side circuit components to the one or more solder balls.

6. The edge card of claim 1, wherein the interposer includes a trace electrically connecting the one or more passive circuit components to the top-side circuit components or to the bottom-side circuit components.

7. The edge card of claim 1, further comprising:
a mold compound on the bottom side of the printed circuit board.

8. The edge card of claim 1, further comprising:
a cavity in the bottom side of the printed circuit board;
wherein at least one of the passive circuit components is in the cavity.

9. A memory device, comprising:
a printed circuit board having a top side and a bottom side;
a plurality of top-side metal contact fingers on the top side of the printed circuit board;
one or more bottom-side circuit components on the bottom side of the printed circuit board, wherein the one or more bottom-side circuit components include one or more memory elements;
an interposer having a top side and a bottom side;
one or more passive circuit components at the top side of the interposer, one or more solder balls arranged around the one or more passive circuit components, wherein the top side of the interposer is coupled to the bottom side of the printed circuit board by at least some of the solder balls; and
one or more bottom-side metal contact fingers at the bottom side of the interposer.

10. The memory device of claim 9, wherein the one or more solder balls are part of a solder ball field that has a pitch less than 0.6 millimeters.

11. The memory device of claim 9, wherein the one or more passive circuit components include a resistor, a capacitor, or an inductor.

12. The memory device of claim 9, wherein the one or more passive circuit components is at least partially embedded in the top side of the interposer to a depth within the interposer so that a top side of the one or more passive circuit components is lower than a top side of the one or more solder balls.

13. The memory device of claim 9, wherein the memory device is a small form factor device.

14. A method of forming an edge card, comprising:
  forming a substrate interposer, wherein forming the substrate interposer includes:
    providing a printed circuit board, the printed circuit board including metal contact fingers proximate an edge of a bottom side of the printed circuit board, one or more solder pads embedded within the printed circuit board, one or more metal traces electrically connecting at least some of the metal contact fingers to at least some of the solder pads, and one or more solder pads on a top side of the printed circuit board;
    exposing the embedded solder pads;
    placing a passive circuit component onto at least some of the exposed embedded solder pads; and
    forming solder balls on each of the one or more solder pads on the top side of the printed circuit board.

15. The method of claim 14, wherein exposing the embedded solder pads includes forming a cavity in the top side of the printed circuit board.

16. The method of claim 15, wherein forming the cavity includes one of milling or laser cutting the top side of the printed circuit board to expose the embedded solder pads.

17. The method of claim 14, wherein the printed circuit board is a first printed circuit board, and the method further includes:
  solder mounting the substrate interposer to a bottom side of a second printed circuit board.

18. The method of claim 17, further comprising:
  providing an encapsulant on the bottom side of the second printed circuit board, the encapsulant encapsulating at least a portion of the top side and the bottom side of the first printed circuit board.

19. The method of claim 18, wherein the metal contact fingers of the substrate interposer are not encapsulated.

20. The method of claim 17, wherein the second printed circuit board includes a plurality of metal contact fingers.

* * * * *